(12) United States Patent
Huang et al.

(10) Patent No.: US 11,882,664 B2
(45) Date of Patent: Jan. 23, 2024

(54) ARTIFICIAL INTELLIGENCE-ASSISTED PRINTED ELECTRONICS SELF-GUIDED OPTIMIZATION METHOD

(71) Applicant: NORTHWESTERN POLYTECHNICAL UNIVERSITY, Shaanxi (CN)

(72) Inventors: Wei Huang, Shaanxi (CN); Xuewen Wang, Shaanxi (CN); Dapeng Wang, Shaanxi (CN); Yue Li, Shaanxi (CN)

(73) Assignee: NORTHWESTERN POLYTECHNICAL UNIVERSITY, Shaanxi (CN)

( * ) Notice: Subject to any disclaimer, the term of this patent is extended or adjusted under 35 U.S.C. 154(b) by 287 days.

(21) Appl. No.: 16/970,873

(22) PCT Filed: May 26, 2020

(86) PCT No.: PCT/CN2020/092253
§ 371 (c)(1),
(2) Date: Feb. 3, 2022

(87) PCT Pub. No.: WO2020/238882
PCT Pub. Date: Dec. 3, 2020

(65) Prior Publication Data
US 2022/0194093 A1 Jun. 23, 2022

(30) Foreign Application Priority Data
May 31, 2019 (CN) .......................... 201910470758.4

(51) Int. Cl.
*H05K 3/12* (2006.01)
*G06F 3/12* (2006.01)

(52) U.S. Cl.
CPC ........... *H05K 3/125* (2013.01); *G06F 3/1208* (2013.01); *G06F 3/1294* (2013.01); *G06F 3/12* (2013.01)

(58) Field of Classification Search
USPC ........................................................ 706/12
See application file for complete search history.

(56) References Cited

U.S. PATENT DOCUMENTS

2011/0248243 A1  10/2011  Chen

FOREIGN PATENT DOCUMENTS

CA   2375365 A1 * 2/2001
CN   1439519 A    9/2003
(Continued)

OTHER PUBLICATIONS

Ning Hong-long et al., "Regulation Rules of Piezoelectric Waveform on Ink-jet Printing Electrode", Chinese Journal of Luminescence, vol. 38 No. 5, May 2017, 6 pages.
(Continued)

*Primary Examiner* — Darryl V Dottin
(74) *Attorney, Agent, or Firm* — Snell & Wilmer LLP

(57) ABSTRACT

The present invention provides an artificial intelligence-assisted printed electronics self-guided optimization method, which integrates machine learning technology with printed electronics. According to variables that impact printing quality of a microelectronic printer, a user sets up experimental groups, prints samples with the microelectronic printer according to parameters in the experiment groups, characterizes printing effects, and evaluates the printing quality. The characterization result is analyzed by machine learning, and printing parameters that correspond to a best printing effect are obtained; then, the parameters are fed back to the user, and the user configures the printer according to the fed-back parameters, thereby improving
(Continued)

printing quality. By using the present invention, optimal printing parameters can be obtained by simply setting up a few simple experiments according to a number of factors that impact printing effects, which reduces the time for a printer user to test out printing effects in an early stage, and provides a good practicability.

5 Claims, 9 Drawing Sheets

(56) References Cited

FOREIGN PATENT DOCUMENTS

| | | | | | |
|---|---|---|---|---|---|
| CN | 101746128 | A | 6/2010 | | |
| CN | 108172524 | A | 6/2018 | | |
| CN | 109130550 | A | 1/2019 | | |
| CN | 110077126 | A | 8/2019 | | |
| EP | 4094947 | A2 * | 11/2022 | .......... | B41J 2/04505 |
| JP | 2010143115 | A | 7/2010 | | |
| JP | 2018069684 | A | 5/2018 | | |
| JP | 2019022166 | A | 2/2019 | | |

OTHER PUBLICATIONS

PCT; International Search Report in the PCT Application No. PCT/CN2020/092253 dated May 26, 2020.

* cited by examiner

FIG. 4D
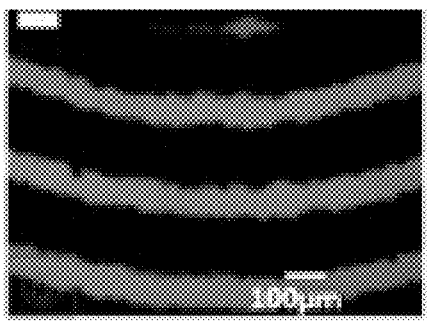
FIG. 4E
FIG. 5A

ARTIFICIAL INTELLIGENCE-ASSISTED PRINTED ELECTRONICS SELF-GUIDED OPTIMIZATION METHOD

This application claims priority to Chinese Patent Application No. 201910470758.4, titled "Artificial Intelligence-Assisted Printed Electronics Self-Guided Optimization Method", filed with the China National Intellectual Property Administration on May 31, 2019, the entire content of which is incorporated herein by reference.

TECHNICAL FIELD

The invention relates to the technical field of printed electronics and computing science and technology, in particular to an artificial intelligence-assisted printed electronics self-guided optimization method.

BACKGROUND

"Control rules of piezoelectric waveform on inkjet printing electrode" published on Chinese Journal of Luminescence, 2017, Vol. 38, No. 5, P617-P622, discloses a method that changes a piezoelectric waveform to control the effect of inkjet printing. This method, on the basis of an original piezoelectric waveform, changes the slew rate and pulse duration of the piezoelectric waveform, uses the changed piezoelectric waveform in printing, characterizes printing effects, and analyzes the piezoelectric waveform that corresponds to a best printing effect. The article analyzes only the impact of piezoelectric waveform on printing effects, ignoring the impact of other factors on printing effects. Moreover, the article includes a relatively small number of experimental groups, can only obtain best parameters in the experimental groups and cannot obtain best printing parameters in actual situations. Using this method to analyze various factors that impact printing effects is time consuming, and difficult to provide best printing parameters.

SUMMARY OF PARTICULAR EMBODIMENTS

In view of this, an object of the present invention is to provide an artificial intelligence-assisted printed electronics self-guided optimization method, which integrates machine learning technology with printed electronics, determines optimal printing parameters according to factors that impact printing effects, reduces the time for a printer user to test out printing effects in an early stage, and provides a good practicability.

In order to achieve the above object, the present invention provides an artificial intelligence-assisted printed electronics self-guided optimization method, including:

Step 1, setting up factors that impact printing quality and experimental groups:

determining a printer, a printing ink and a printing substrate are suitable;

dividing six variables, the number of jetting holes of the printer, the number of times of printing, a printing speed, a temperature of the printing substrate, the distance between a nozzle and the substrate, and an inkjet intensity of the nozzle, into six groups, where each group consists of four uniformly varying parameters, totaling 24 printing parameter combinations, the six variables being factors that impact printing quality;

when printing with any one of the parameter condition groups, setting the rest five parameter condition groups to have fixed printing parameters;

Step 2, designing a printing pattern:

after the printing parameters are determined, designing a printing pattern, where straight lines of the printing pattern have a line width of 10 μm and a line distance of 110 μm, curves of the printing pattern have a line width of 80 μm and a line distance of 160 μm;

Step 3, printing sample patterns according to the 24 printing parameter combinations:

setting printing parameters according to the 24 printing parameter combinations; printing out actual patterns according to the designed printing pattern, the actual patterns being sample patterns;

Step 4, characterizing printing effects:

characterizing straight line positions and curve positions of the sample patterns by an optical microscope, where as the number of jetting holes increases, details of the printing pattern deteriorate and lines connect with one another; as the distance between the nozzle and the substrate increases, a curvature of the lines increases; the smaller an average of line widths is, the closer the average of line widths is to a designed value and the smaller a standard deviation of the line widths is, the better the printing effect is; and data characterizing printing effects includes an average of sample pattern line widths and a standard deviation of sample pattern line widths for each combination of the 24 printing parameter combinations;

Step 5, analyzing the data by machine learning:

uploading the data characterizing printing effects to a computer; analyzing the data by machine learning to obtain printing parameters corresponding to a best printing effect;

Step 6, returning the parameters to a user computer, and guiding the user in improving printing quality:

transmitting by the computer the printing parameters obtained in step 5 back to a printer control program; modifying automatically by the control program printing parameters of the microelectronic printer and printing, to obtain an improved printing pattern; characterizing the improved printing pattern under an optical microscope, uploading line width averages and line width standard deviations to a computer, performing machine learning and improving printing effect.

Optionally, the dividing six variables, the number of jetting holes of the printer, the number of times of printing, a printing speed, a temperature of the printing substrate, the distance between a nozzle and the substrate, and an inkjet intensity of the nozzle, into six groups, where each group consists of four uniformly varying parameters, totaling 24 printing parameter combinations, comprises:

determining the number of jetting holes of the printer as a first group, the parameters in the first group are 1, 2, 4 and 6;

determining the number of times of printing as a second group, the parameters in the second group are 1, 2, 4 and 6;

determining a printing speed as a third group, the parameters in the third group are 50 mm/s, 100 mm/s, 150 mm/s and 200 mm/s;

determining a temperature of the printing substrate as a fourth group, the parameters in the fourth group are 21° C., 30° C., 40° C. and 50° C.;

determining the distance between a nozzle and the substrate as a fifth group, the parameters in the fifth group are 0.1 mm, 0.6 mm, 1.1 mm and 2.1 mm;

determining and an inkjet intensity of the nozzle as a sixth group, the parameters in the sixth group are 65%, 75%, 85% and 95%.

Optionally, the setting the rest five parameter condition groups to have fixed printing parameters when printing with any one of the parameter condition groups comprises:

when determining the impact of the number of jetting holes on printing quality, setting the number of jetting holes of the printer according to the first group of parameters respectively and printing, with the rest five groups of conditions being as follows: the number of times of printing is 1, the printing speed is 150 mm/s, the temperature of the printing substrate is room temperature, the distance between the nozzle and the substrate is 0.1 mm, and the inkjet intensity of the nozzle is 100%;

when determining the impact of the number of times of printing on printing quality, setting the number of times of printing according to the second group of parameters respectively and printing, with the rest five groups of conditions being as follows: the number of jetting holes of the printer is 1, the printing speed is 150 mm/s, the temperature of the printing substrate is room temperature, the distance between the nozzle and the substrate is 0.1 mm, and the inkjet intensity of the nozzle is 100%;

when determining the impact of the printing speed on printing quality, setting the printing speed according to the third group of parameters respectively and printing, with the rest five groups of conditions being as follows: the number of jetting holes of the printer is 1, the number of times of printing is 1, the temperature of the printing substrate is room temperature, the distance between the nozzle and the substrate is 0.1 mm, and the inkjet intensity of the nozzle is 100%;

when determining the impact of the temperature of the printing substrate on printing quality, setting the temperature of the printing substrate according to the fourth group of parameters respectively and printing, with the rest five groups of conditions being as follows: the number of jetting holes of the printer is 1, the number of times of printing is 1, the printing speed is 150 mm/s, the distance between the nozzle and the substrate is 0.1 mm, and the inkjet intensity of the nozzle is 100%;

when determining the impact of the distance between the nozzle and the substrate on printing quality, setting the distance between the nozzle and the substrate according to the fifth group of parameters respectively and printing, with the rest five groups of conditions being as follows: the number of jetting holes of the printer is 1, the number of times of printing is 1, the printing speed is 150 mm/s, the temperature of the printing substrate is room temperature, and the inkjet intensity of the nozzle is 100%;

when determining the impact of the inkjet intensity of the nozzle on printing quality, setting the inkjet intensity of the nozzle according to the sixth group of parameters respectively and printing, with the rest five groups of conditions being as follows: the number of jetting holes of the printer is 1, the number of times of printing is 1, the printing speed is 150 mm/s, the temperature of the printing substrate is room temperature, and the distance between the nozzle and the substrate is 0.1 mm.

Optionally, the characterizing straight line positions and curve positions of the sample patterns by an optical microscope comprises:

selecting five positions on the printing pattern, comprising three different positions of straight lines and two different positions of curves;

observing the sample pattern by an optical microscope, to obtain optical microscope images of the five positions for each printing parameter combination;

measuring line width by the optical microscope, where three lines are measured for their line widths at each position, to obtain nine measurement values from the straight lines and six measurement values from the curves;

determining an average and a standard deviation of the nine measurement values of the straight lines, and determining an average and a standard deviation of the six measurement values of the curves;

gathering the averages of the sample pattern line widths and the standard deviations of the sample pattern line widths for each of the 24 printing parameter groups, to obtain data characterizing printing effects.

Optionally, the analyzing the data by machine learning to obtain printing parameters corresponding to a best printing effect comprises:

determining printing parameters corresponding to a best printing effect based on the data characterizing printing effects by using a GBDT algorithm, where the printing parameters corresponding to a best printing effect are printing parameters of the printing parameter set that result in a minimum line width average and a minimum line width standard deviation of the sample patterns; the number of printing parameters in the printing parameter set is $a^b$ where a represents the uniformly varying parameter and b represents the factors that impact printing quality, and a=4, and b=6.

According to the specific embodiments provided by the present invention, the following technical effects are disclosed:

The present invention provides an artificial intelligence-assisted printed electronics self-guided optimization method, which integrates machine learning technology with printed electronics. According to variables that impact printing quality of a microelectronic printer, a user sets up experimental groups, prints samples with the microelectronic printer according to parameters in the experiment groups, characterizes printing effects, and evaluates the printing quality. The characterization result is analyzed by machine learning, and printing parameters that correspond to a best printing effect are obtained; then, the parameters are fed back to the user, and the user configures the printer according to the fed-back parameters, thereby improving printing quality. As the number of users of the microelectronic printer increases, the amount of sample data obtained by the computer increases, thereby improving the accuracy of the computer machine learning result, and improving the effect of the samples printed according to the printing parameters fed back to the user. By using the present invention, optimal printing parameters can be obtained by simply setting up a few simple experiments according to a number of factors that impact printing effects, which reduces the time for a printer user to test out printing effects in an early stage, and provides a good practicability.

BRIEF DESCRIPTION OF THE DRAWINGS

In order to more clearly illustrate the technical solutions of the embodiments of the present invention or in the prior art, accompanying drawings used in the descriptions of the embodiments are described below. As a matter of course, the drawings described herein are merely some embodiments of the present invention; other drawings can be obtained by those skilled in the art according to these drawings without inventive effort.

FIG. 4D is an optical microscope image of a first position in the curves according to an embodiment of the present invention;

FIG. 4E is an optical microscope image of a second position in the curves according to an embodiment of the present invention;

FIG. 5A shows optical microscope images of printing samples when the factor that impacts printing quality is the number of jetting holes according to an embodiment of the present invention;

DETAILED DESCRIPTION OF PARTICULAR EMBODIMENTS

Figure 1:
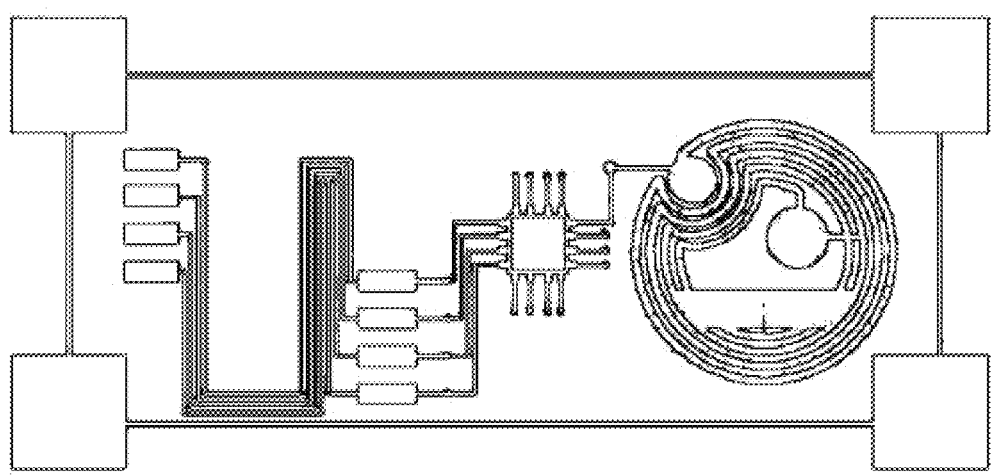
FIG. 1 is a circuit diagram of a printing pattern designed according to an embodiment of the present invention.

The technical solutions of the embodiments of the present invention will be clearly and completely described in connection with the accompanying drawings. As a matter of course, the embodiments described herein are merely some embodiments of the present invention; those skilled in the art can obtain other embodiments based on the embodiments described herein without inventive effort. All of those embodiments shall fall within the scope of the present invention.

In the artificial intelligence-assisted printed electronics self-guided optimization method according to the present invention, a user controls printing parameters, and printing effects are evaluated and quantified; the quantized data are uploaded to a computer, and machine learning is conducted on the data to analyze which parameters produce the best printing effect; the result is returned to a printer control software interface used by the user, and the user can perform printing operations according to the data.

Specifically, the method includes the following specific steps:

Step 1, setting up factors that impact printing quality and experimental groups.

In the present invention, the printer is a microelectronic printer. First, when the printing ink and the printing substrate are determined suitable, factors that may impact printer printing quality are analyzed. There are six main factors that impact printing quality: the number of jetting holes of the printer, the number of times of printing, the printing speed, the temperature of the printing substrate, the distance between the nozzle and the substrate, and the inkjet intensity of the nozzle. Other factors that impact printing quality include: the voltage waveform for controlling the ink-jetting of the printer nozzle, the magnitude of the air pressure between the cartridge and the ink damper, the magnitude of the air pressure of the laboratory where the printer is located. The six variables are divided into six groups, each group consisting of four uniformly varying parameters. Alternatively, each group may consist of five or more parameters. Factors impacting printing quality, and printing parameters are shown in Table 1.

TABLE 1

| Factors impacting printing quality and printing parameters | | | | |
|---|---|---|---|---|
| | 1st | 2nd | 3rd | 4th |
| Number of jetting holes of printer | 1 | 2 | 4 | 6 |
| Number of times of printing | 1 | 2 | 4 | 6 |
| Printing speed (mm/s) | 50 | 100 | 150 | 200 |
| Temperature of printing substrate (° C.) | 21 | 30 | 40 | 50 |
| Distance between nozzle and substrate (mm) | 0.1 | 0.6 | 1.1 | 2.1 |
| Inkjet intensity of nozzle | 65% | 75% | 85% | 95% |

According to Table 1, there are a total of 4×4×4×4×4=4096 combinations of printing parameters, and it would be difficult for a single user to test out all the combinations. Therefore, a grouping-based experiment is adopted, i.e., when studying one group of conditions, the rest five groups are set to have fixed parameters, where the fixed parameters have little impact on printing effects of the group being tested. When studying the impact of the number of jetting holes on printing quality, the number of jetting holes of the printer are set to be 1, 2, 4 and 6 respectively and printing is performed correspondingly, the rest five groups of conditions are set as follows: the number of times of printing is 1, the printing speed is 150 mm/s, the temperature of the printing substrate is room temperature, the distance between the nozzle and the substrate is 0.1 mm, and the inkjet intensity of the nozzle is 100%. When studying the impact of the number of times of printing on printing quality, the number of times of printing is set to be 1, 2, 4 and 6 respectively and printing is performed correspondingly, the rest five groups of conditions are set as follows: the number of jetting holes of the printer is 1, the printing speed is 150 mm/s, the temperature of the printing substrate is room temperature, the distance between the nozzle and the substrate is 0.1 mm, and the inkjet intensity of the nozzle is 100%. When studying the impact of the printing speed on printing quality, the printing speed is set to be 50 mm/s, 100 mm/s, 150 mm/s and 200 mm/s respectively and printing is performed correspondingly, the rest five groups of conditions are set as follows: the number of jetting holes of the printer is 1, the number of times of printing is 1, the temperature of the printing substrate is room temperature, the distance between the nozzle and the substrate is 0.1 mm, and the inkjet intensity of the nozzle is 100%. When studying the impact of the temperature of the printing substrate on printing quality, the temperature of the printing substrate is set to be 21° C., 30° C., 40° C. and 50° C. respectively and printing is performed correspondingly, the rest five groups of conditions are set as follows: the number of jetting holes of the printer is 1, the number of times of printing is 1, the printing speed is 150 mm/s, the distance between the nozzle and the substrate is 0.1 mm, and the inkjet intensity of the nozzle is 100%. When studying the impact of the distance between the nozzle and the substrate on printing quality, the distance between the nozzle and the substrate is set to be 0.1 mm, 0.6 mm, 1.1 mm and 2.1 mm respectively and printing is performed correspondingly, the rest five groups of conditions are set as follows: the number of jetting holes of the printer is 1, the number of times of printing is 1, the printing speed is 150 mm/s, the temperature of the printing substrate is room temperature, and the inkjet intensity of the nozzle is 100%. When studying the impact of the inkjet intensity of the nozzle on printing quality, the inkjet intensity of the nozzle is set to be 65%, 75%, 85% and 95% of the total voltage respectively and printing is performed correspondingly, the rest five groups of conditions are set as follows: the number of jetting holes of the printer is 1, the number of times of printing is 1, the printing speed is 150 mm/s, the temperature of the printing substrate is room temperature, and the distance between the nozzle and the substrate is 0.1 mm. A nozzle is integrated with 16 jetting holes.

Step 2, designing a printing pattern

After the printing parameters are determined, a printing pattern is designed. Because the impacts of the printing parameters on straight lines and curves are to be analyzed, a structure with straight lines and curves is designed. As shown in FIG. 1, the straight lines of the printing pattern have a line width of 10 μm, and a line distance of 110 μm; the curves of the printing pattern have a line width of 80 μm, and a line distance of 160 μm.

Figure 2:
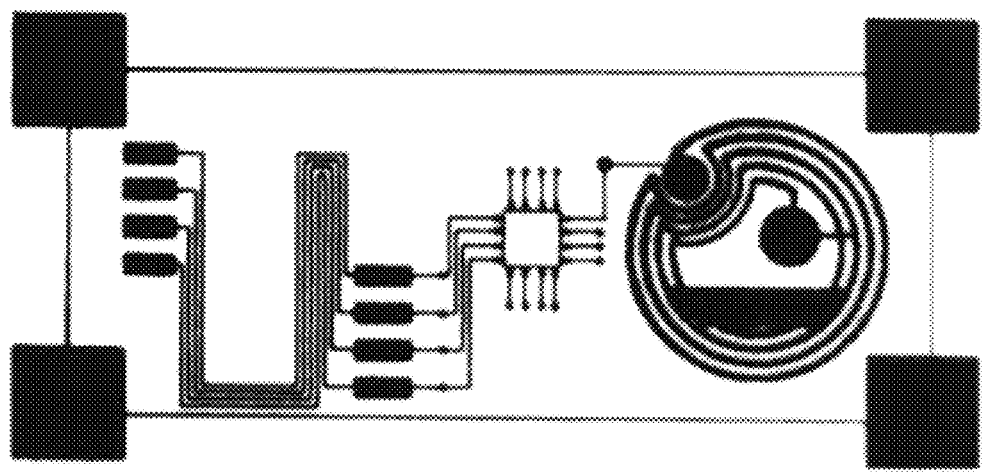
FIG. 2 is a circuit diagram of a sample pattern according to an embodiment of the present invention.

Step 3, printing sample patterns according to the 24 printing parameter combinations Printing parameters are set according to the 24 printing parameter combinations, actual patterns are printed out according to the designed printing pattern, the actual patterns being sample patterns. As shown in FIG. 2, the actual patterns that are printed out look consistent with the designed printing pattern, and the lines are clear and distinguishable.

Step 4, characterizing printing effects

Figure 3:
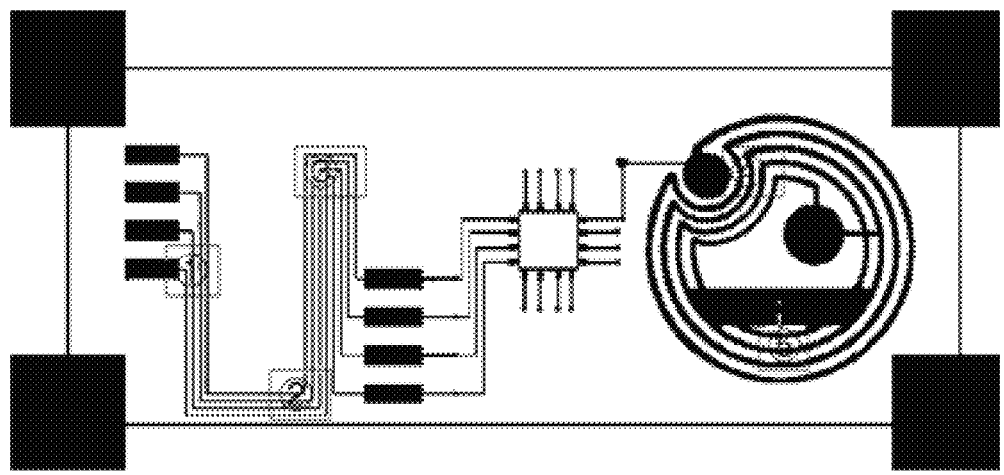
FIG. 3 is a schematic diagram of sampled points according to an embodiment of the present invention.
Figure 4A:
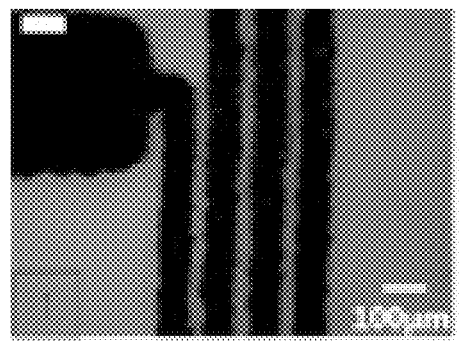
FIG. 4A is an optical microscope image of a first position in the straight lines according to an embodiment of the present invention.
Figure 4B:
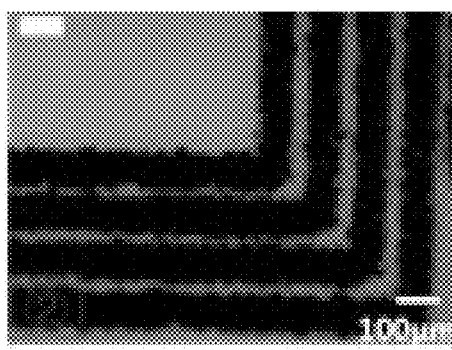
FIG. 4B is an optical microscope image of a second position in the straight lines according to an embodiment of the present invention.
Figure 4C:
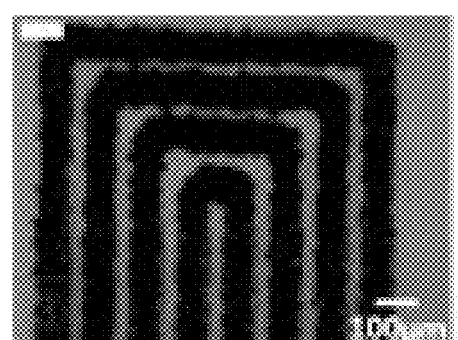
FIG. 4C is an optical microscope image of a third position in the straight lines according to an embodiment of the present invention.

As shown in FIG. 3, three different positions of the straight lines and two different positions of the curves are selected on the designed printing pattern, and corresponding positions on the straight lines and the curves of the samples are characterized respectively by using an optical microscope. FIG. 4A is an optical microscope image of a first position in the straight lines; FIG. 4B is an optical microscope image of a second position in the straight lines; FIG. 4C is an optical microscope image of a third position in the straight lines; FIG. 4D is an optical microscope image of a first position in the curves; and FIG. 4E is an optical microscope image of a second position in the curves. FIG. 4A to FIG. 4E are optical microscope images of five positions under one set of printing parameters.

Figure 5B:
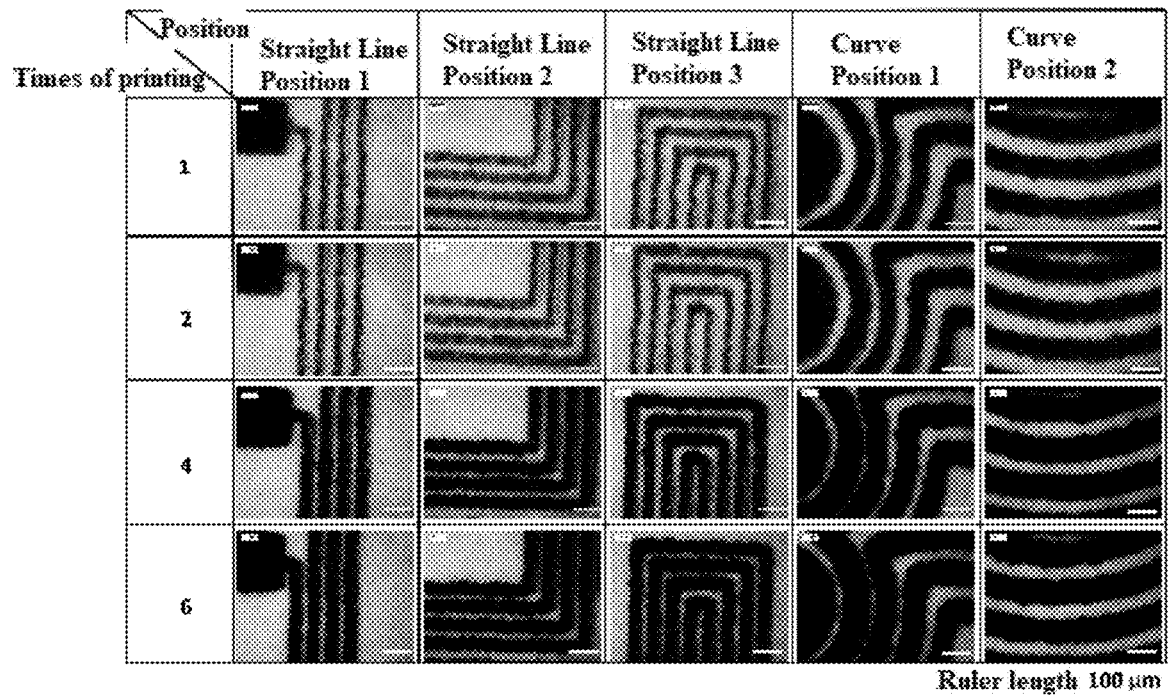
FIG. 5B shows optical microscope images of printing samples when the factor that impacts printing quality is the number of times of printing according to an embodiment of the present invention.
Figure 5C:
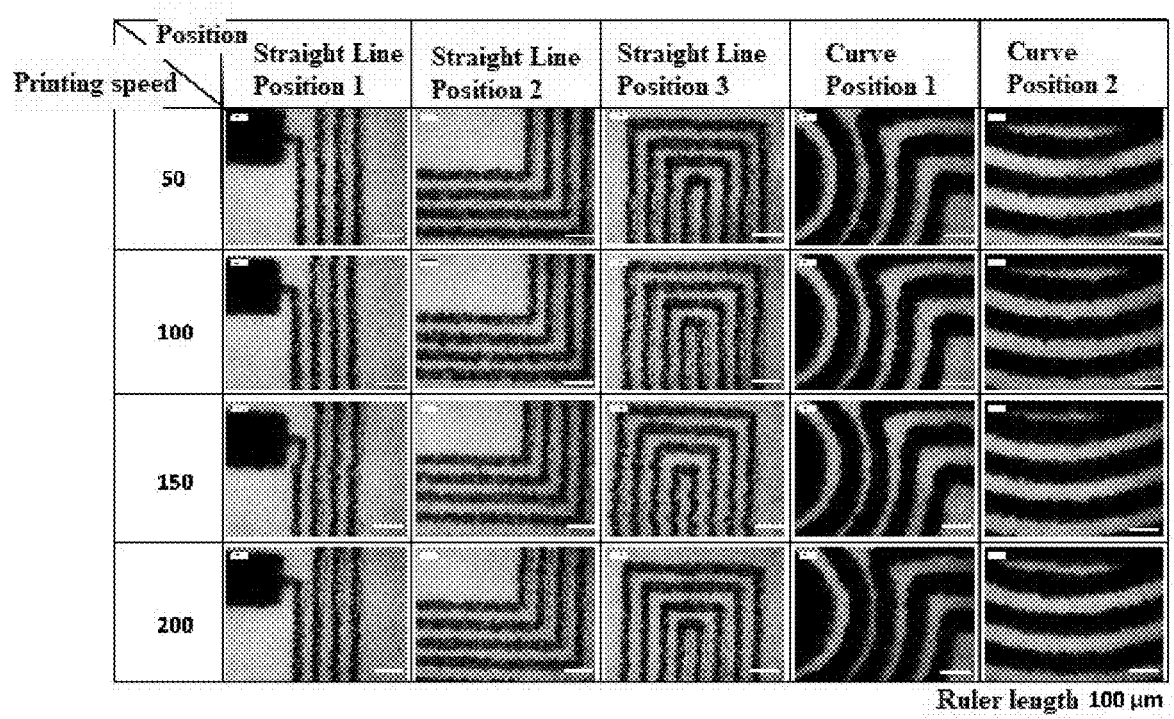
FIG. 5C shows optical microscope images of printing samples when the factor that impacts printing quality is the printing speed according to an embodiment of the present invention.
Figure 5D:
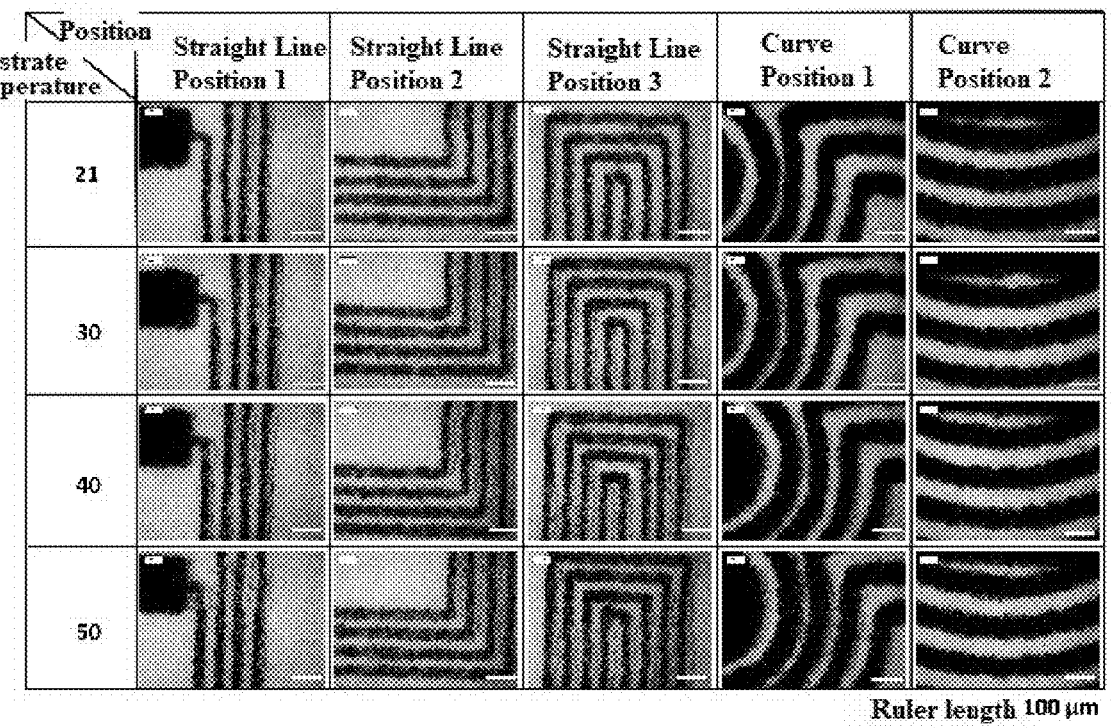
FIG. 5D shows optical microscope images of printing samples when the factor that impacts printing quality is the temperature of the printing substrate according to an embodiment of the present invention.
Figure 5E:
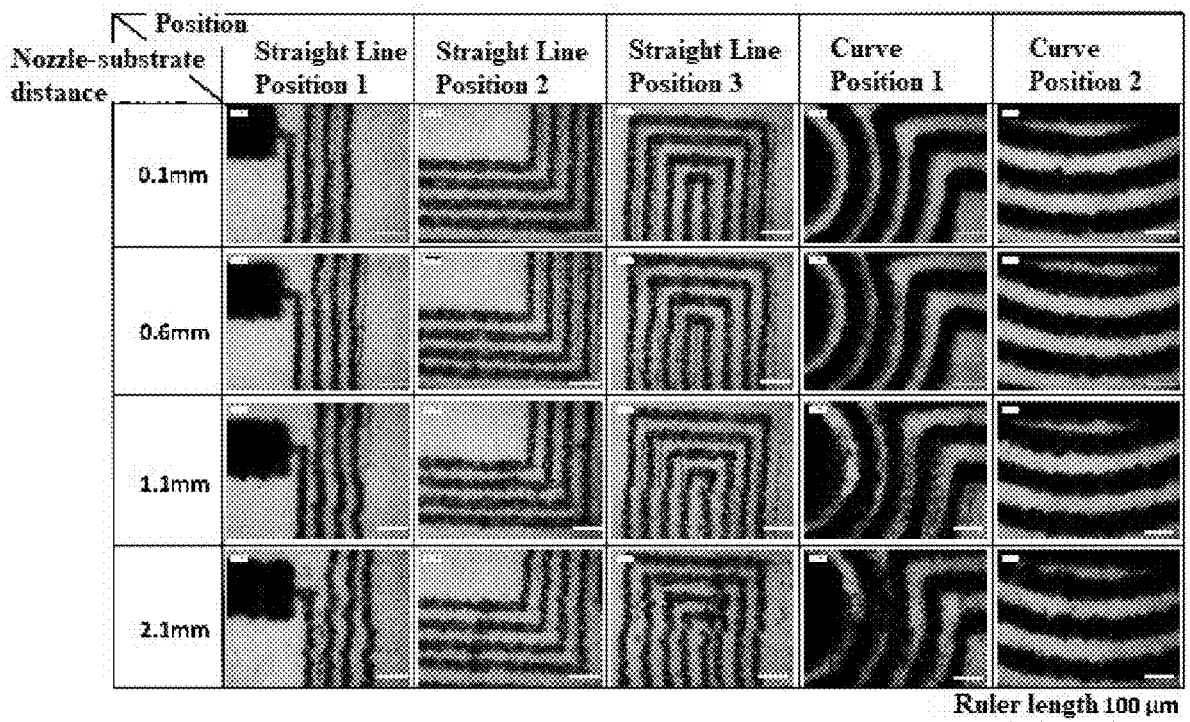
FIG. 5E shows optical microscope images of printing samples when the factor that impacts printing quality is the distance between the nozzle and the substrate according to an embodiment of the present invention.
Figure 5F:
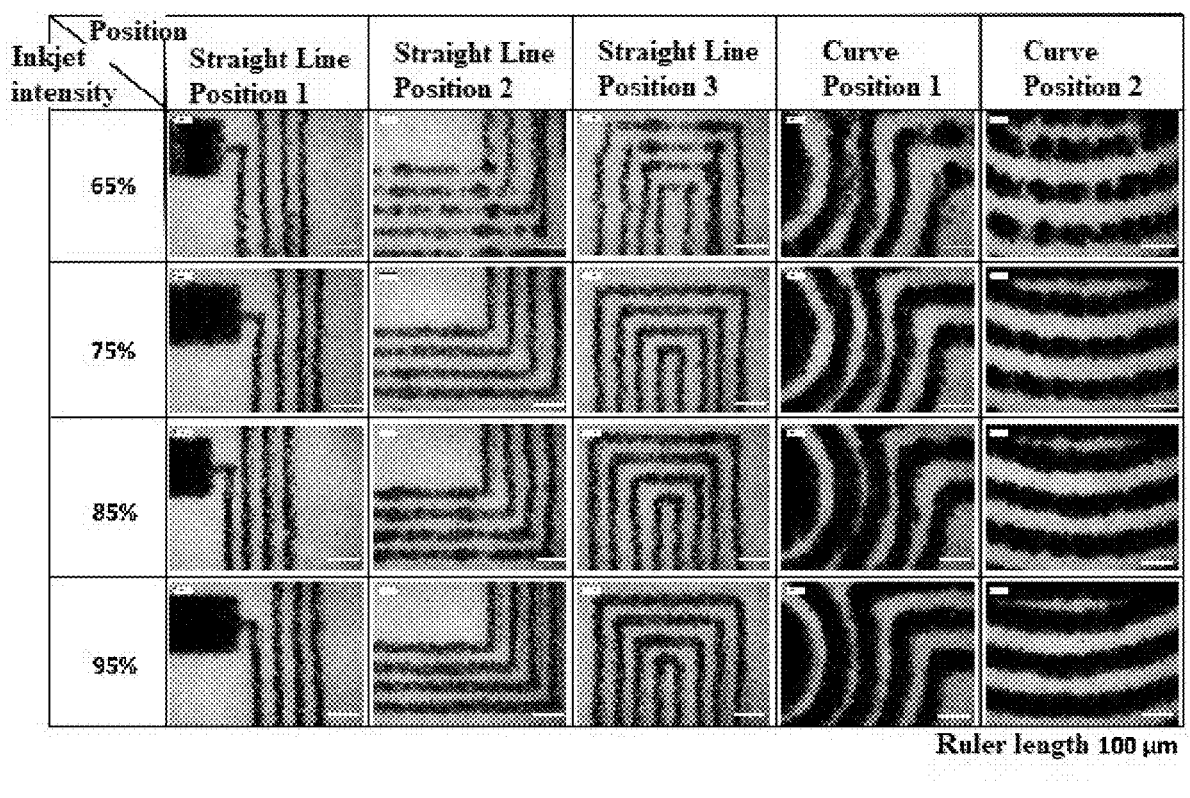
FIG. 5F shows optical microscope images of printing samples when the factor that impacts printing quality is the inkjet intensity of the nozzle according to an embodiment of the present invention.

FIG. 5A shows optical microscope images of printing samples when the factor that impacts printing quality is the number of jetting holes; FIG. 5B shows optical microscope images of printing samples when the factor that impacts printing quality is the number of times of printing; FIG. 5C shows optical microscope images of printing samples when the factor that impacts printing quality is the printing speed; FIG. 5D shows optical microscope images of printing samples when the factor that impacts printing quality is the temperature of the printing substrate; FIG. 5E shows optical microscope images of printing samples when the factor that impacts printing quality is the distance between the nozzle and the substrate; FIG. 5F shows optical microscope images of printing samples when the factor that impacts printing quality is the inkjet intensity of the nozzle. FIG. 5A to FIG. 5F are optical microscope images of the printing sample under all 24 parameter combinations. It can be seen that the three factors, the number of jetting holes, the distance between the nozzle and the substrate and the inkjet intensity of the nozzle, have a relatively great impact on printing effects. Clearly, as the number of jetting holes increases, the details of the printing pattern deteriorate and the lines connect with one another. As the distance between the nozzle and the substrate increases, the length that a droplet travels from the nozzle to the substrate increases, and because of the horizontal movement of the droplet, the droplet lands onto the substrate in a parabolic path, and therefore the deviation of the landing of the droplet increases. In other words, as the distance between the nozzle and the substrate increases, the curvature of the lines increases (this phenomenon is more apparent on straight lines; on the curves, this phenomenon occurs, but not as apparent). The inkjet intensity of the nozzle is controlled by a voltage for ink jetting; as the voltage decreases, the amount of ink shot out decreases, and in some cases no ink will be shot out and on the optical microscope image some lines can be seen to be disconnected. The three factors directly determine the quality of the printed product. An increased number of times of printing will lead to a darker color of the lines, which may translate to a smaller impedance of the wires and a better electrical performance.

Figure 6A:
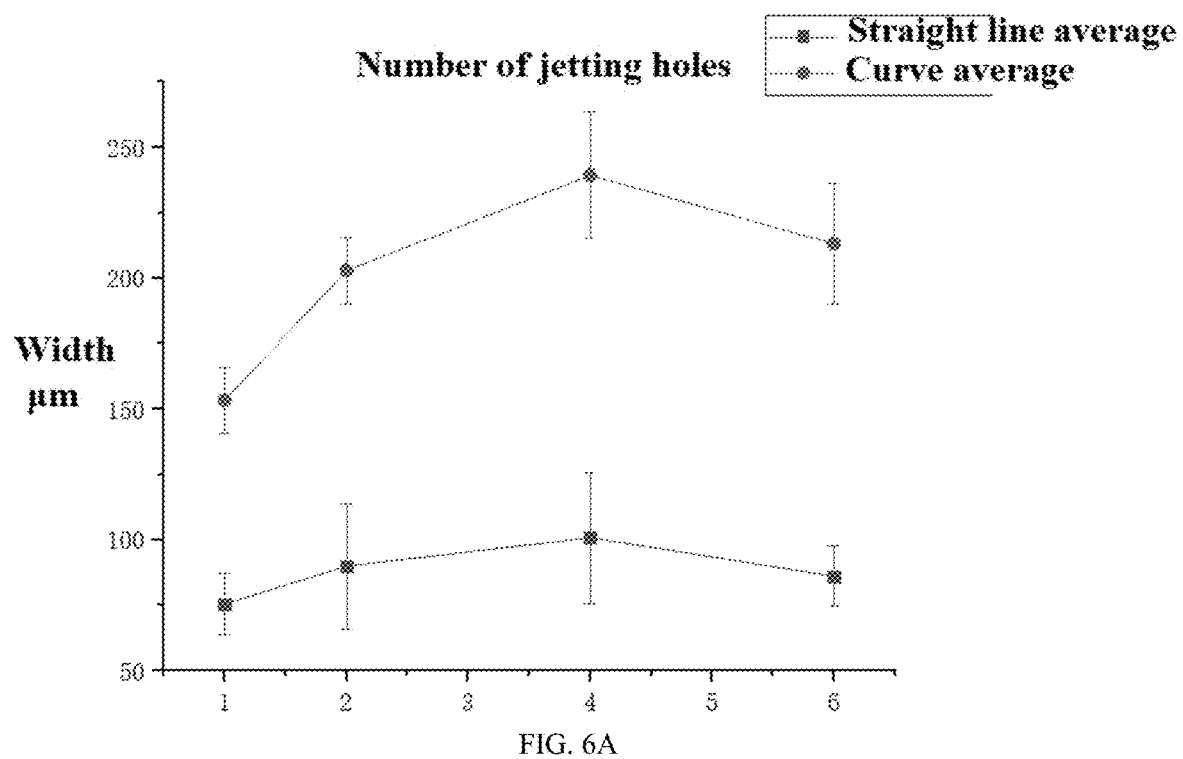
FIG. 6A is a schematic diagram of the impact on the printing effect when the factor that impacts printing quality is the number of jetting holes according to an embodiment of the present invention.
Figure 6B:
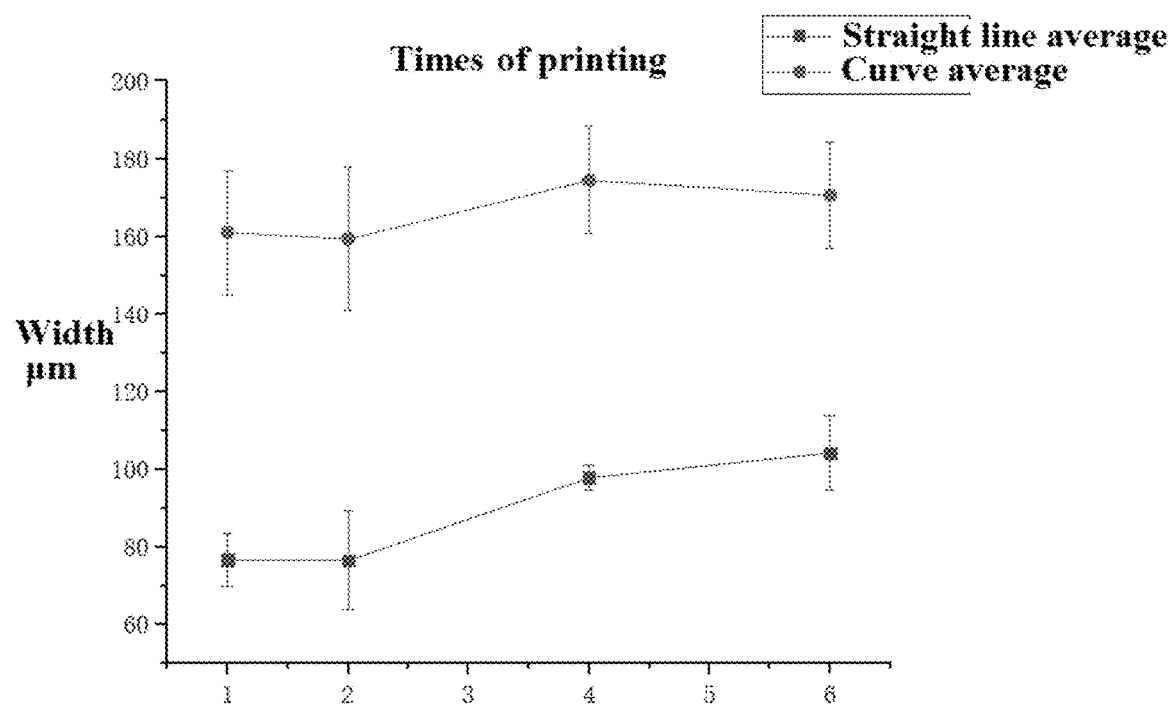
FIG. 6B is a schematic diagram of the impact on the printing effect when the factor that impacts printing quality is the number of times of printing according to an embodiment of the present invention.
Figure 6C:
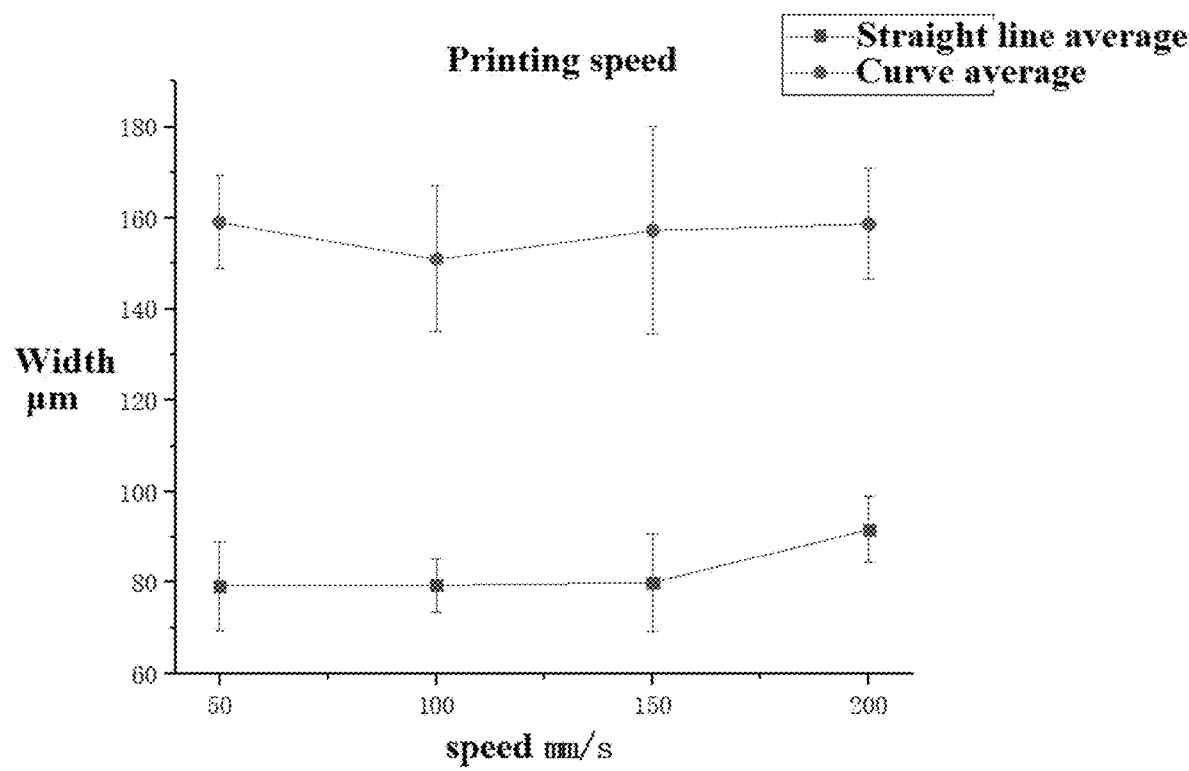
FIG. 6C is a schematic diagram of the impact on the printing effect when the factor that impacts printing quality is the printing speed according to an embodiment of the present invention.
Figure 6D:
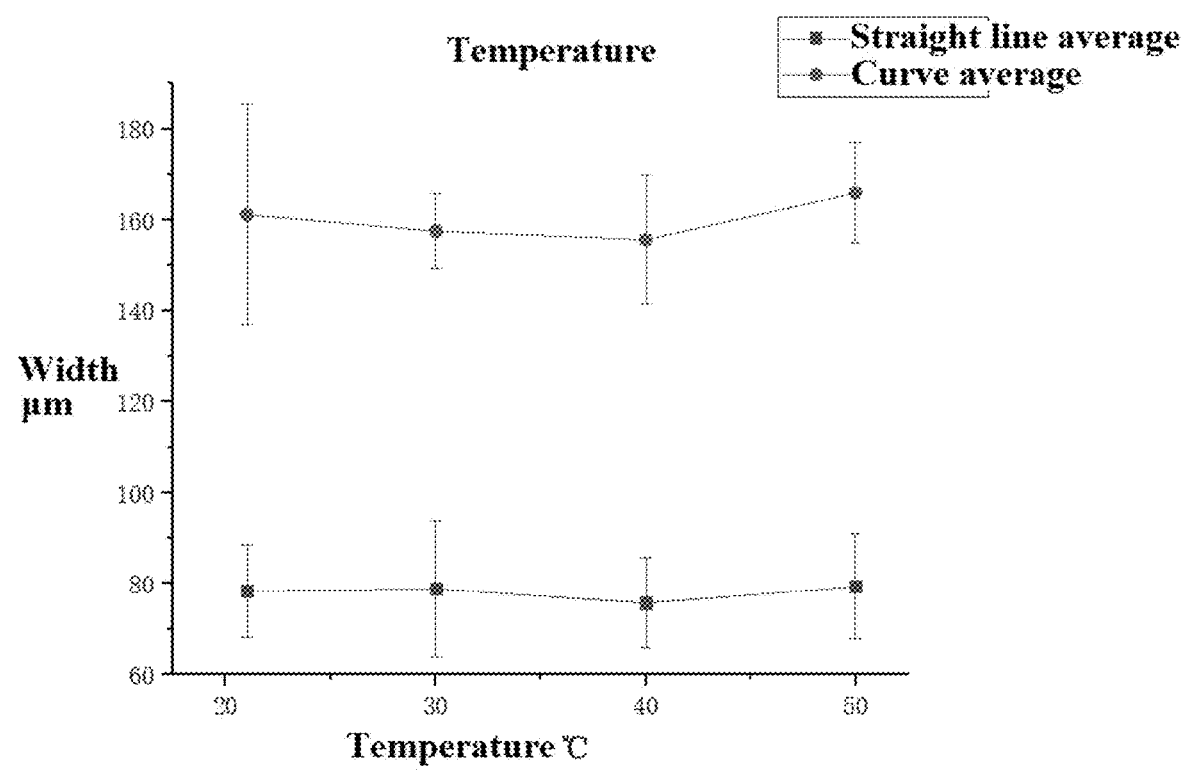
FIG. 6D is a schematic diagram of the impact on the printing effect when the factor that impacts printing quality is the temperature of the printing substrate according to an embodiment of the present invention.
Figure 6E:
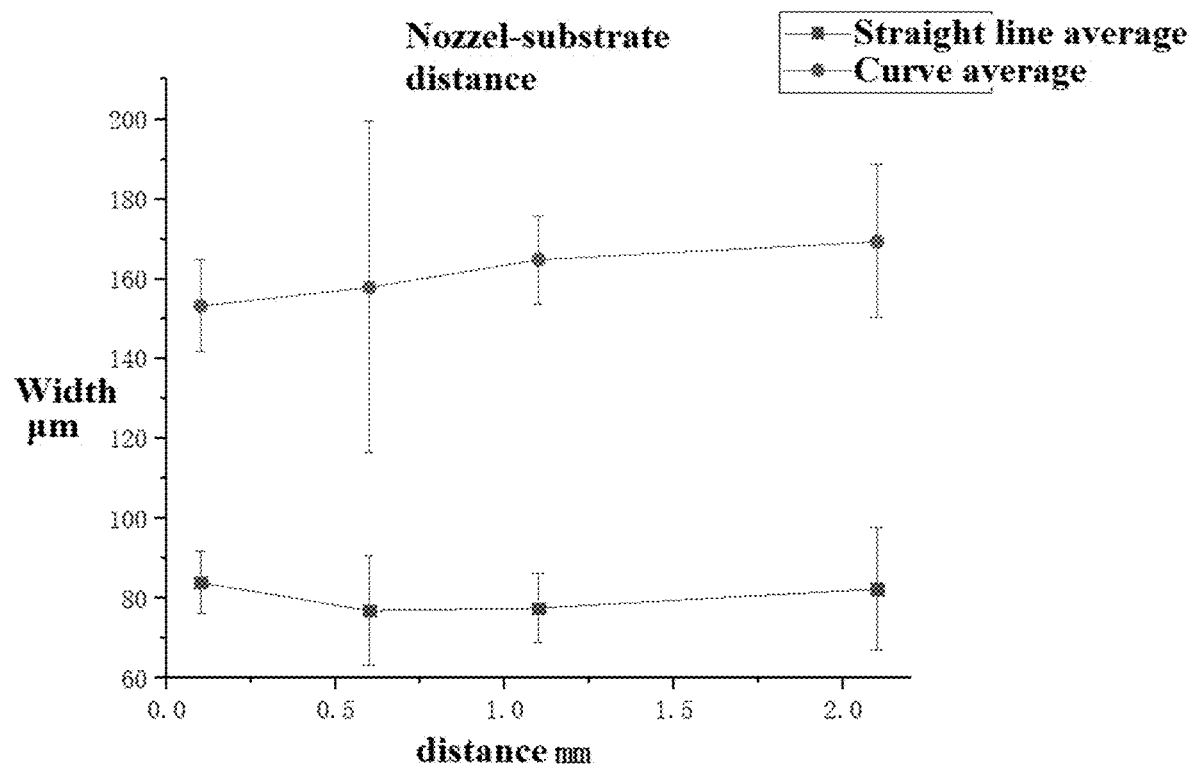
FIG. 6E is a schematic diagram of the impact on the printing effect when the factor that impacts printing quality is the distance between the nozzle and the substrate according to the embodiment of the present invention.
Figure 6F:
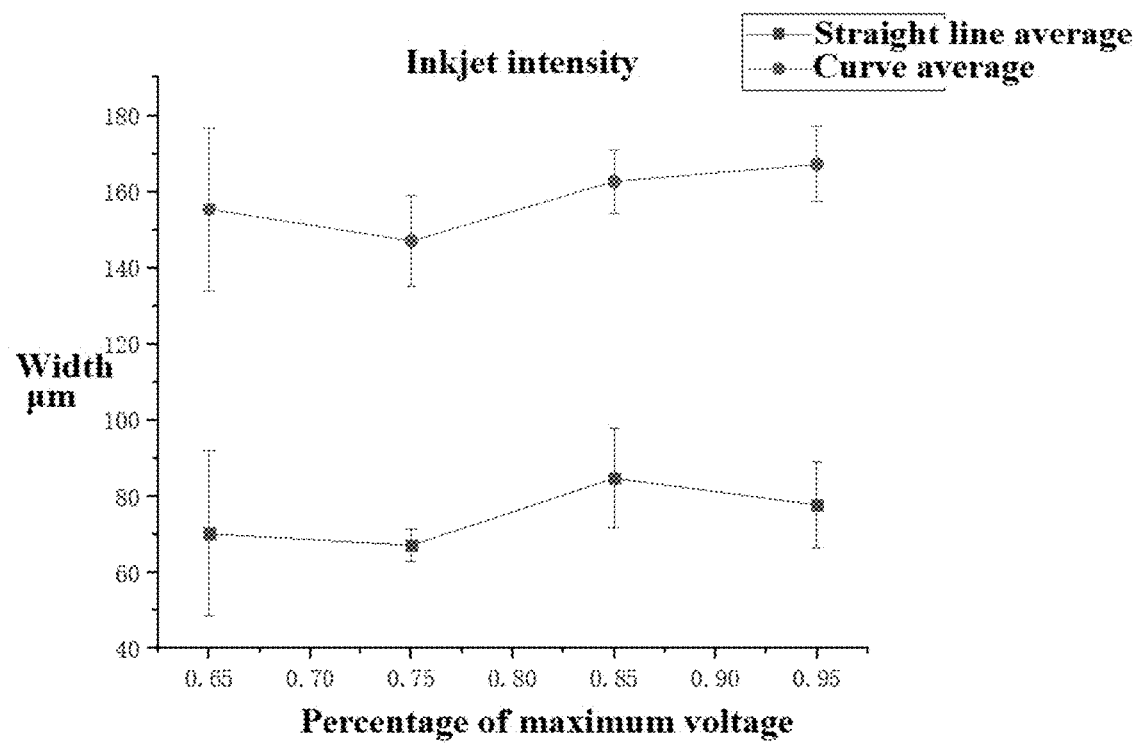
FIG. 6F is a schematic diagram of the impact on the printing effect when the factor that impacts printing quality is the inkjet intensity of the nozzle according to an embodiment of the present invention.

Line widths can be measured from the optical microscope images shown in FIG. 5A to FIG. 5F. At each position, three lines are measured for their line widths; accordingly, each printing pattern has nine measurement values from the straight lines, and six measurement values from the curves. The average and standard deviation of the nine measurement values from the straight lines and the six measurement values from the curves are calculated respectively, and printing effects are evaluated based on the averages and the standard deviations. The smaller the average is, the closer it is to a designed value and the smaller the standard deviation is, the better the printing effect is. The average and standard deviation data are made into tables to observe their change trends. FIG. 6A to FIG. 6F show the impacts of six factors on printing effect, respectively. In FIG. 6A to FIG. 6F, the ordinate represents the width of a wire. In FIG. 6A, the abscissa represents the number of jetting holes; in FIG. 6B, the abscissa represents the number of times of printing; in FIG. 6C, the abscissa represents the printing speed in mm/s; in FIG. 6D, the abscissa represents the temperature of the printing substrate in ° C.; in FIG. 6E, the abscissa represents the distance between the nozzle and the substrate in mm; in FIG. 6F, the abscissa represents the percentage of the maximum voltage of the voltage waveform for controlling the ink-jetting of the nozzle when printing is performed to the maximum allowable voltage of the printer inkjet voltage waveform. As the number of times of printing increases, the line widths of the straight lines and the curves gradually increase, and the standard deviations of the line widths gradually stabilize. When the distance between the nozzle and the substrate is minimum, the printing speed, i.e., the speed at which the nozzle moves, has little impact on printing effects. The line widths increase only by a little as the printing speed increases. When the temperature rises, the line width increases more but the standard deviations are more stable.

Step 5, analyzing the data by machine learning

The averages and the standard deviations of the line widths of the sample patterns under the 24 printing parameter combinations and corresponding printing parameters are uploaded to a computer, and a program is written using machine learning technology. In order to optimize the printing parameters of the organic conductive ink, a fuzzy relation between the printing parameters is to be determined. Therefore, it is desirable to select a Machine Learning (ML) model that best summarizes the fuzzy relation according to the obtained printing data, to generate an optimal printing condition, and provide a high success rate.

Model selection: Model selection includes three basic components: data acquisition, data preprocessing and model evaluation. The data preprocessing includes two steps, random oversampling and normalization. To solve the problem of unbalanced sample distribution in the data set, a random oversampling method is adopted, which repeatedly randomly selects a certain class of marked samples with a smaller number and puts the samples back into the data set until the data sets of the two classes have the same count. Then the data sets that have been balanced are normalized, and the feature values are scaled to speed up the convergence of model training. To solve the problem of small data set, a nested cross verification scheme is adopted. The model evaluation mainly includes two steps: 1) inner layer cross validation: selecting optimal hyper-parameters for each candidate model; 2) outer layer cross validation: testing each model to evaluate the performance of each model on a new data set. The best model is then selected based on the resulting test results. According to the present invention, a GBDT method is adopted for machine learning to obtain the optimal printing parameters.

Self-adaptive incremental model (incremental learning): first, listing existing laboratory-printed data combinations, then performing experimental testing on the combinations, and generating data samples as an initial training set where there are at least 10 samples in each class to meet a minimum sample criterion of the training model. A GDBT training method is used on the samples. First, the initial training set is subjected to hierarchical cross validation, and the optimal hyper-parameters of the model are selected. Then the trained model is used to predict the probabilities that the remaining parameter combinations have "good effects". Then experimental tests are conducted on the parameter combination with the highest probability, and labels are generated and carried to the training set of the next test. The same steps are repeated until the process reaches a critical point (where all the combinations of the remaining set is predicted to have "bad effects", that is, the highest prediction probability is lower than 50.0%). At this moment, the training is stopped because the confidence of the model to the remaining combinations is low.

Gradient descent tree (GBDT): Gradient descent tree (GBDT) is a typical gradient boosting technique, and gradient descent is used in gradient boosting trees. Gradient descent tree (GBDT) uses a set of values generated from M base deciders $h_m$ (m=1, 2, . . . , M) to decide:

$$F_m(x)=\Sigma_1^M \gamma_m h_m(x)$$

where $F_m(x)$ is a decision function, $\gamma_m$ is a learning parameter, m is a base decider number, and M is the total number of the base deciders.

When N training data data $\{(x_i, y_i)\}_{i=1}^N$ and a differentiable loss function $f_L(y, F(x))$ are known, where F(X) represents a fitting function value, y represents an experimental true value, and the loss function represents the difference between the fitting function value and the experimental true value, training is performed in an iterative manner:

$F_m(x)=F_{m-1}(x)+\gamma_m h_m(x)$, where $\gamma_m$ is determined by minimizing the loss function corresponding to the next model. In each step, the residual $\gamma_m$ is a negative gradient of the loss function corresponding to the current model $F_{m-1}(x)$. Then, training is performed on $h_m(x)$ using $\{(x_i, r_{mi})\}_{i=1}^N$, where $x_i$ is the i-th data, and $r_{mi}$ is the residual of the i-th data.

ROC curve (Receiver Operating Characteristic Curve): ROC curve is a curve that measures the performance of a two-class model. To draw a ROC graph of a model, the GBDT method is adopted, which combines parameter adjusting and model selection, and produces a model with only a small error between the training set and the test set. In out layer cross validation, the data set is layered to achieve optimal parameter training, and to provide probability values of the samples to be predicted; in inner layer cross validation, cross validation and parameter adjusting are realized in the training set, and then the result is fed back to the hyper-parameter optimization mechanism, where the hyper-parameters are optimized, and the updated hyper-parameters are used to continue training the model.

TPR and NPR: TPR (True Positive Rate) is defined as the number of correctly predicted positives divided by the total number of actual positive samples. NPR (True Negative Rate) represents the number of correctly predicted negatives divided by the total number of actual negative samples. The positive class represents "good effect" while the negative class represents "bad effect". The prediction results are from the model generated by the data set. When the numbers of positive and negative samples are balanced to the greatest extent possible, the ROC of the model is more balanced.

The averages and the standard deviations obtained under each set of printing conditions are subjected to machine learning in the manner described above. The printing effect changes approximately linearly with the printing parameters, that is, when the other conditions do not change, a gradual increase (decrease) of four parameters under one printing condition will lead to a gradual improvement (deterioration) of the printing effect, and the improvement (deterioration) is approximately linear. In this way, printing parameters that result in the minimum line width average and minimum line width standard deviation of the printing samples can be acquired through machine learning from the $4^6=4096$ printing parameter combinations under the six printing conditions and four printing parameters.

Step 6, returning the parameters to a user computer, and guiding the user in improving printing quality The computer transmits the printing parameters back to the printer control program. The control program automatically modifies the printing parameters of the microelectronic printer and print, to obtain an improved printing pattern. The newly obtained printing pattern is characterized under an optical microscope, and the averages of the line widths and the standard deviation data are uploaded to the computer. The more subsequent users are, the greater the amount of sample data is, thereby gradually expanding the database, improving the accuracy of the machine learning result, and increasing the level of satisfaction of the printing effect.

The present invention provides an artificial intelligence-assisted printed electronics self-guided optimization method, which integrates machine learning technology with printed electronics. According to variables that impact printing quality of a microelectronic printer, a user sets up experimental groups, prints samples with the microelectronic printer according to parameters in the experiment groups, characterizes printing effects, and evaluates the printing quality. The characterization result is analyzed by machine learning, and printing parameters that correspond to a best printing effect are obtained; then, the parameters are fed back to the user, and the user configures the printer according to the fed-back parameters, thereby improving printing quality. As the number of users of the microelectronic printer increases, the amount of sample data obtained by the computer increases, thereby improving the accuracy of the computer machine learning result, and improving the effect of the samples printed according to the printing parameters fed back to the user. By using the present invention, optimal printing parameters can be obtained by simply setting up a few simple experiments according to a number of factors that impact printing effects, which reduces the time for a printer user to test out printing effects in an early stage, and provides a good practicability.

Specific examples are used in the descriptions of the principle and embodiments of the present invention. It should be noted that the descriptions are for illustrative purposes only, for a better understanding of the method and idea of the present invention. Those skilled in the art can may modifications to the embodiments or applications based on the idea of the present invention. To sum up, the description herein shall not be construed as limiting the scope of the present invention.

What is claimed is:

1. An artificial intelligence-assisted printed electronics self-guided optimization method, comprising:

Step 1, setting up factors that impact printing quality and experimental groups:
   determining a printer, a printing ink and a printing substrate are suitable;
   dividing six variables, the number of jetting holes of the printer, the number of times of printing, a printing speed, a temperature of the printing substrate, the distance between a nozzle and the substrate, and an inkjet intensity of the nozzle, into six groups, where each group consists of four uniformly varying parameters, totaling 24 printing parameter combinations, the six variables being factors that impact printing quality;
   when printing with any one of the parameter condition groups, setting the rest five parameter condition groups to have fixed printing parameters;

Step 2, designing a printing pattern:
   after the printing parameters are determined, designing a printing pattern, where straight lines of the printing pattern have a line width of 10 μm and a line distance of 110 μm, curves of the printing pattern have a line width of 80 μm and a line distance of 160 μm;

Step 3, printing sample patterns according to the 24 printing parameter combinations:
   setting printing parameters according to the 24 printing parameter combinations; printing out actual patterns according to the designed printing pattern, the actual patterns being sample patterns;

Step 4, characterizing printing effects:
   characterizing straight line positions and curve positions of the sample patterns by an optical microscope, where as the number of jetting holes increases, details of the printing pattern deteriorate and lines connect with one another; as the distance between the nozzle and the substrate increases, a curvature of the lines increases; the smaller an average of line widths is, the closer the average of line widths is to a designed value and the smaller a standard deviation of the line widths is, the better the printing effect is; and data characterizing printing effects includes an average of sample pattern line widths and a standard deviation of sample pattern line widths for each combination of the 24 printing parameter combinations;

Step 5, analyzing the data by machine learning:
   uploading the data characterizing printing effects to a computer; analyzing the data by machine learning to obtain printing parameters corresponding to a best printing effect;

Step 6, returning the parameters to a user computer, and guiding the user in improving printing quality:
   transmitting by the computer the printing parameters obtained in step 5 back to a printer control program; modifying automatically by the control program printing parameters of the microelectronic printer and printing, to obtain an improved printing pattern; characterizing the improved printing pattern under an optical microscope, uploading line width averages and line width standard deviations to a computer, performing machine learning and improving printing effect.

2. The artificial intelligence-assisted printed electronics self-guided optimization method according to claim 1, wherein the dividing six variables, the number of jetting holes of the printer, the number of times of printing, a printing speed, a temperature of the printing substrate, the distance between a nozzle and the substrate, and an inkjet intensity of the nozzle, into six groups, where each group consists of four uniformly varying parameters, totaling 24 printing parameter combinations, comprises:

determining the number of jetting holes of the printer as a first group, the parameters in the first group are 1, 2, 4 and 6;

determining the number of times of printing as a second group, the parameters in the second group are 1, 2, 4 and 6;

determining a printing speed as a third group, the parameters in the third group are 50 mm/s, 100 mm/s, 150 mm/s and 200 mm/s;

determining a temperature of the printing substrate as a fourth group, the parameters in the fourth group are 21° C., 30° C., 40° C. and 50° C.;

determining the distance between a nozzle and the substrate as a fifth group, the parameters in the fifth group are 0.1 mm, 0.6 mm, 1.1 mm and 2.1 mm;

determining and an inkjet intensity of the nozzle as a sixth group, the parameters in the sixth group are 65%, 75%, 85% and 95%.

3. The artificial intelligence-assisted printed electronics self-guided optimization method according to claim 2, wherein the setting the rest five parameter condition groups to have fixed printing parameters when printing with any one of the parameter condition groups comprises:

when determining the impact of the number of jetting holes on printing quality, setting the number of jetting holes of the printer according to the first group of parameters respectively and printing, with the rest five groups of conditions being as follows: the number of times of printing is 1, the printing speed is 150 mm/s, the temperature of the printing substrate is room temperature, the distance between the nozzle and the substrate is 0.1 mm, and the inkjet intensity of the nozzle is 100%;

when determining the impact of the number of times of printing on printing quality, setting the number of times of printing according to the second group of parameters respectively and printing, with the rest five groups of conditions being as follows: the number of jetting holes of the printer is 1, the printing speed is 150 mm/s, the temperature of the printing substrate is room temperature, the distance between the nozzle and the substrate is 0.1 mm, and the inkjet intensity of the nozzle is 100%;

when determining the impact of the printing speed on printing quality, setting the printing speed according to the third group of parameters respectively and printing, with the rest five groups of conditions being as follows: the number of jetting holes of the printer is 1, the number of times of printing is 1, the temperature of the printing substrate is room temperature, the distance between the nozzle and the substrate is 0.1 mm, and the inkjet intensity of the nozzle is 100%;

when determining the impact of the temperature of the printing substrate on printing quality, setting the temperature of the printing substrate according to the fourth group of parameters respectively and printing, with the rest five groups of conditions being as follows: the number of jetting holes of the printer is 1, the number of times of printing is 1, the printing speed is 150 mm/s, the distance between the nozzle and the substrate is 0.1 mm, and the inkjet intensity of the nozzle is 100%;

when determining the impact of the distance between the nozzle and the substrate on printing quality, setting the distance between the nozzle and the substrate according to the fifth group of parameters respectively and printing, with the rest five groups of conditions being as follows: the number of jetting holes of the printer is 1, the number of times of printing is 1, the printing speed is 150 mm/s, the temperature of the printing substrate is room temperature, and the inkjet intensity of the nozzle is 100%;

when determining the impact of the inkjet intensity of the nozzle on printing quality, setting the inkjet intensity of the nozzle according to the sixth group of parameters respectively and printing, with the rest five groups of conditions being as follows: the number of jetting holes of the printer is 1, the number of times of printing is 1, the printing speed is 150 mm/s, the temperature of the printing substrate is room temperature, and the distance between the nozzle and the substrate is 0.1 mm.

4. The artificial intelligence-assisted printed electronics self-guided optimization method according to claim 3, wherein the characterizing straight line positions and curve positions of the sample patterns by an optical microscope comprises:

selecting five positions on the printing pattern, comprising three different positions of straight lines and two different positions of curves;

observing the sample pattern by an optical microscope, to obtain optical microscope images of the five positions for each printing parameter combination;

measuring line width by the optical microscope, where three lines are measured for their line widths at each position, to obtain nine measurement values from the straight lines and six measurement values from the curves;

determining an average and a standard deviation of the nine measurement values of the straight lines, and determining an average and a standard deviation of the six measurement values of the curves;

gathering the averages of the sample pattern line widths and the standard deviations of the sample pattern line widths for each of the 24 printing parameter groups, to obtain data characterizing printing effects.

5. The artificial intelligence-assisted printed electronics self-guided optimization method according to claim 4, wherein the analyzing the data by machine learning to obtain printing parameters corresponding to a best printing effect comprises:

determining printing parameters corresponding to a best printing effect based on the data characterizing printing effects by using a GBDT algorithm, where the printing parameters corresponding to a best printing effect are printing parameters of the printing parameter set that result in a minimum line width average and a minimum line width standard deviation of the sample patterns; the number of printing parameters in the printing parameter set is $a^b$ where a represents the uniformly varying parameters and b represents the factors that impact printing quality, and a=4, and b=6.

* * * * *